US009357676B2

(12) United States Patent
Yamaguchi et al.

(10) Patent No.: US 9,357,676 B2
(45) Date of Patent: May 31, 2016

(54) COOLING DEVICE AND ELECTRONIC APPARATUS

(71) Applicant: FUJITSU LIMITED, Kawasaki-shi, Kanagawa (JP)

(72) Inventors: Goki Yamaguchi, Kawasaki (JP); Sonomasa Kobayashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 263 days.

(21) Appl. No.: 13/912,764

(22) Filed: Jun. 7, 2013

(65) Prior Publication Data

US 2014/0092559 A1 Apr. 3, 2014

(30) Foreign Application Priority Data

Sep. 28, 2012 (JP) ................................ 2012-216610

(51) Int. Cl.
| H05K 7/20 | (2006.01) |
| G06F 1/20 | (2006.01) |
| F28D 15/02 | (2006.01) |
| F28F 1/24 | (2006.01) |
| F04D 25/06 | (2006.01) |

(52) U.S. Cl.
CPC ........ *H05K 7/20336* (2013.01); *F28D 15/0233* (2013.01); *F28D 15/0275* (2013.01); *F28F 1/24* (2013.01); *G06F 1/203* (2013.01); *F04D 25/0613* (2013.01)

(58) Field of Classification Search
CPC . H01L 2924/00; H01L 23/473; H01L 23/427; H01L 23/467; H01L 23/4334; H01L 23/367; G06F 1/203; G06F 1/20; G06F 2200/201; H05K 7/20254; H05K 7/209

USPC .............................. 361/679.52, 700, 702, 720
See application file for complete search history.

(56) References Cited

U.S. PATENT DOCUMENTS

| 4,167,771 | A | * | 9/1979 | Simons ......................... 361/715 |
| 5,168,919 | A | * | 12/1992 | Berenholz et al. ........... 165/80.4 |
| 5,343,940 | A | * | 9/1994 | Jean ......................... 165/104.33 |
| 6,041,850 | A | * | 3/2000 | Esser et al. ............... 165/104.33 |
| 6,118,347 | A |   | 9/2000 | Ohira |
| 6,191,946 | B1 | * | 2/2001 | Yu et al. ......................... 361/704 |
| 7,336,490 | B2 | * | 2/2008 | Harris et al. ................... 361/704 |
| 2003/0193794 | A1 |   | 10/2003 | Reis et al. |

(Continued)

FOREIGN PATENT DOCUMENTS

| JP | 11-220237 A | 8/1999 |
| JP | 11-307975 A | 11/1999 |

(Continued)

OTHER PUBLICATIONS

Office Action dated Mar. 29, 2016, issued in counterpart Japanese Patent Application No. 2012-216610, with partial English translation (6 pages).

*Primary Examiner* — Adam B Dravininkas
(74) *Attorney, Agent, or Firm* — Westerman, Hattori, Daniels & Adrian, LLP

(57) ABSTRACT

A cooling device includes: a heat dissipating part disposed at an end of a heat transfer member; a heat-receiving plate disposed at the other end of the heat transfer member, provided opposite to a noise-generating part mounted on a circuit board, and thermally coupled to the noise-generating part; and a shielding unit disposed at the other end of the heat transfer member, the shielding unit covering the noise-generating part.

14 Claims, 13 Drawing Sheets

(56) References Cited

U.S. PATENT DOCUMENTS

| | | | |
|---|---|---|---|
| 2007/0133174 A1* | 6/2007 | Mikami | G06F 1/203 361/700 |
| 2007/0258218 A1* | 11/2007 | Peng et al. | 361/715 |
| 2009/0073655 A1* | 3/2009 | Takakusaki | G06F 1/1616 361/679.49 |
| 2009/0142956 A1* | 6/2009 | Ma | 439/485 |
| 2012/0193076 A1* | 8/2012 | Sakamoto et al. | 165/104.21 |

FOREIGN PATENT DOCUMENTS

| | | |
|---|---|---|
| JP | 2002-324989 A | 11/2002 |
| JP | 2006-513556 A | 4/2006 |
| JP | 2007-034699 A | 2/2007 |
| JP | 2008-060310 A | 3/2008 |
| JP | 2008-084019 A | 4/2008 |

* cited by examiner

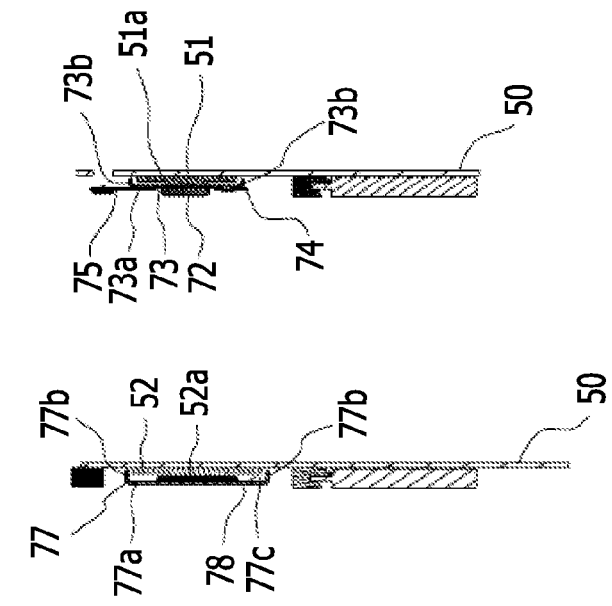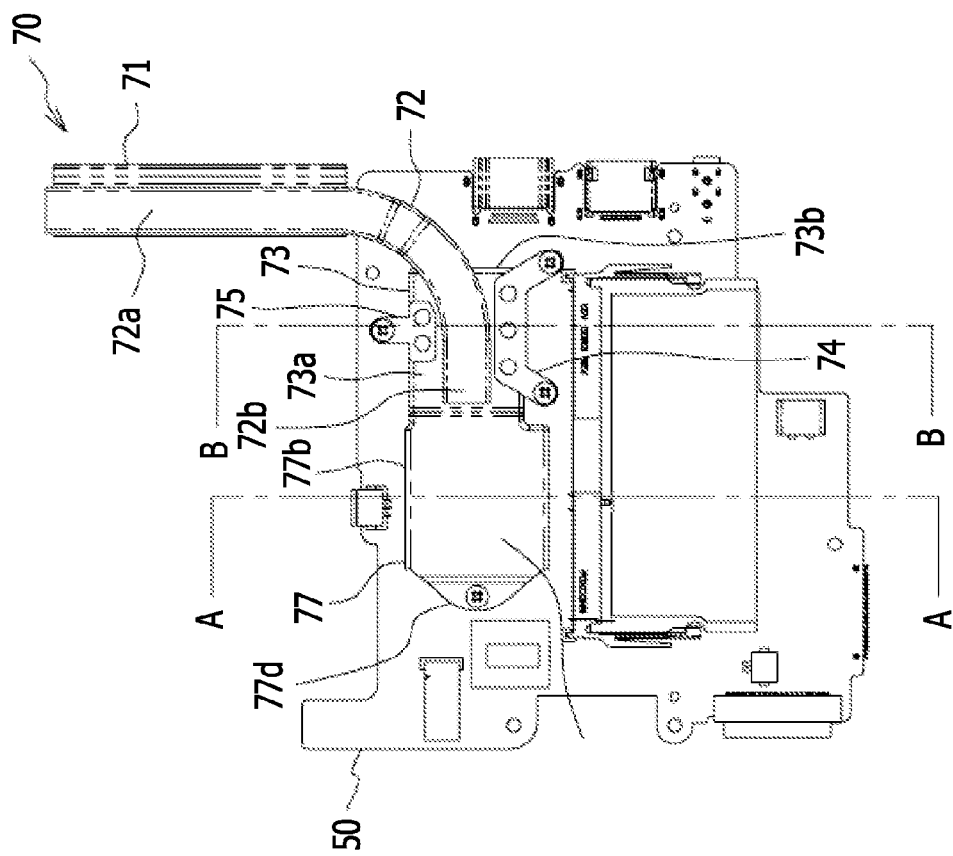

COOLING DEVICE AND ELECTRONIC APPARATUS

CROSS-REFERENCE TO RELATED APPLICATION

This application is based upon and claims the benefit of priority from the prior Japanese Patent Application No. 2012-216610 filed on Sep. 28, 2012, the entire contents of which are incorporated herein by reference.

FIELD

The embodiments discussed herein are related to a cooling device and an electronic apparatus.

BACKGROUND

To cool heat-generating electronic parts included in an electronic apparatus, a conventional cooling device has a heat sink connected to a heat receiving part, which is brought into contact with a heat-generating electronic part, through a heat transfer member. The heat sink dissipates heat by using air forcibly blown by a cooling fan. Amounts of heat generated by electronic parts included in electronic apparatuses tend to increase.

A related technology is disclosed in Japanese Laid-open Patent Publication No. 2008-60310 or 2002-324989.

SUMMARY

According to one aspect of the embodiments, a cooling device includes: a heat dissipating part disposed at an end of a heat transfer member; a heat-receiving plate disposed at the other end of the heat transfer member, provided opposite to a noise-generating part mounted on a circuit board, and thermally coupled to the noise-generating part; and a shielding unit disposed at the other end of the heat transfer member, the shielding unit covering the noise-generating part.

The object and advantages of the invention will be realized and attained by means of the elements and combinations particularly pointed out in the claims.

It is to be understood that both the foregoing general description and the following detailed description are examples and explanatory and are not restrictive of the invention, as claimed.

BRIEF DESCRIPTION OF DRAWINGS

FIGS. 10A to 10C illustrate an example of a cooling device.

DESCRIPTION OF EMBODIMENTS

Figure 1:
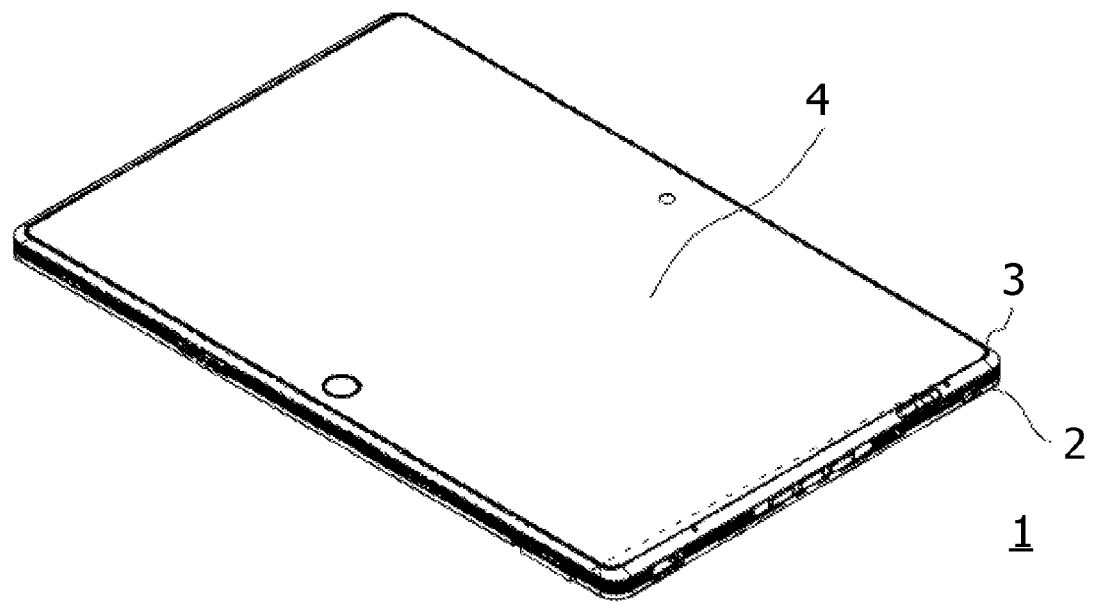
FIG. 1 illustrates an example of an electronic apparatus.

An electronic apparatus including an antenna element and other elements affected by noise has a shielding sheet metal as a countermeasure against noise. For example, a shielding plate used as a countermeasure against electromagnetic interference is employed to dissipate heat from a printed circuit board. A shielding plate included in a heat dissipating structure covers an entire printed circuit board, and has contacts that continuously extend from the main body of the shielding plate toward the printed circuit board. The contacts are brought into contact with electronic parts on the printed circuit board to dissipate heat.

The dimensions of individual portions in the drawings, their ratios, and the like may not match those of actual portions.

Figure 2:
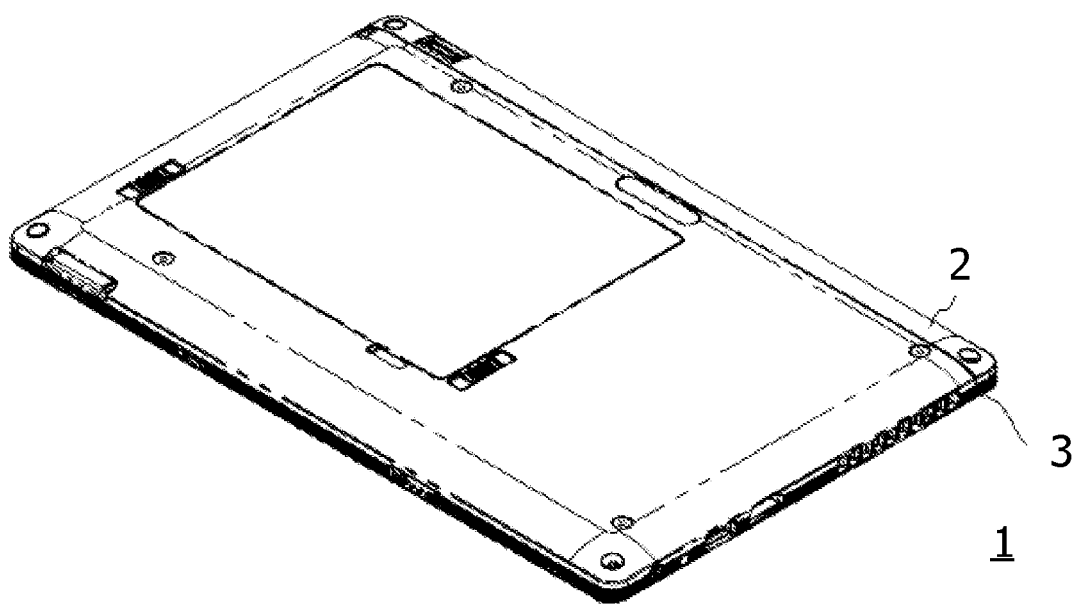
FIG. 2 illustrates an example of an electronic apparatus.
Figure 3:
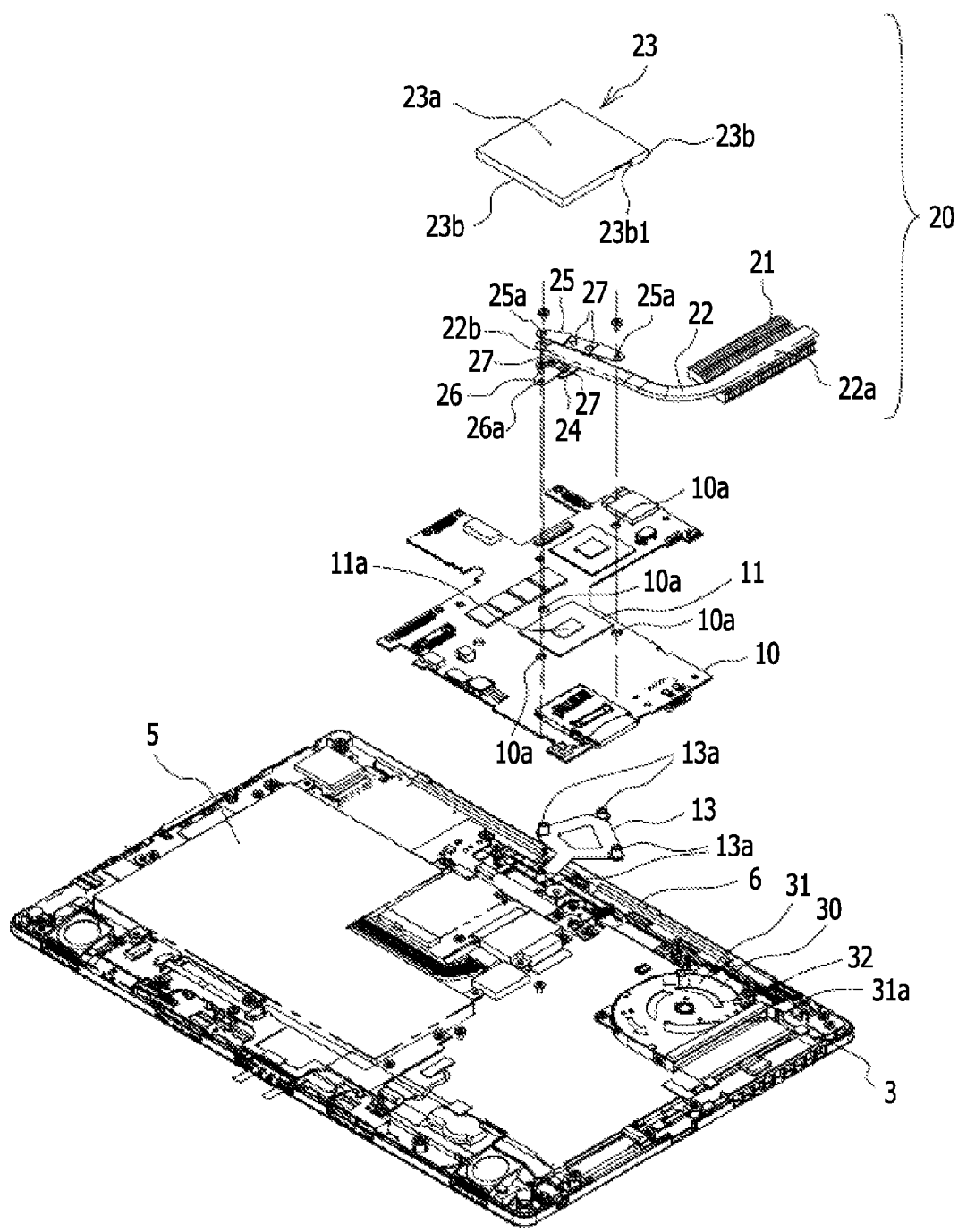
FIG. 3 illustrates an example of an electronic apparatus.
Figure 4:
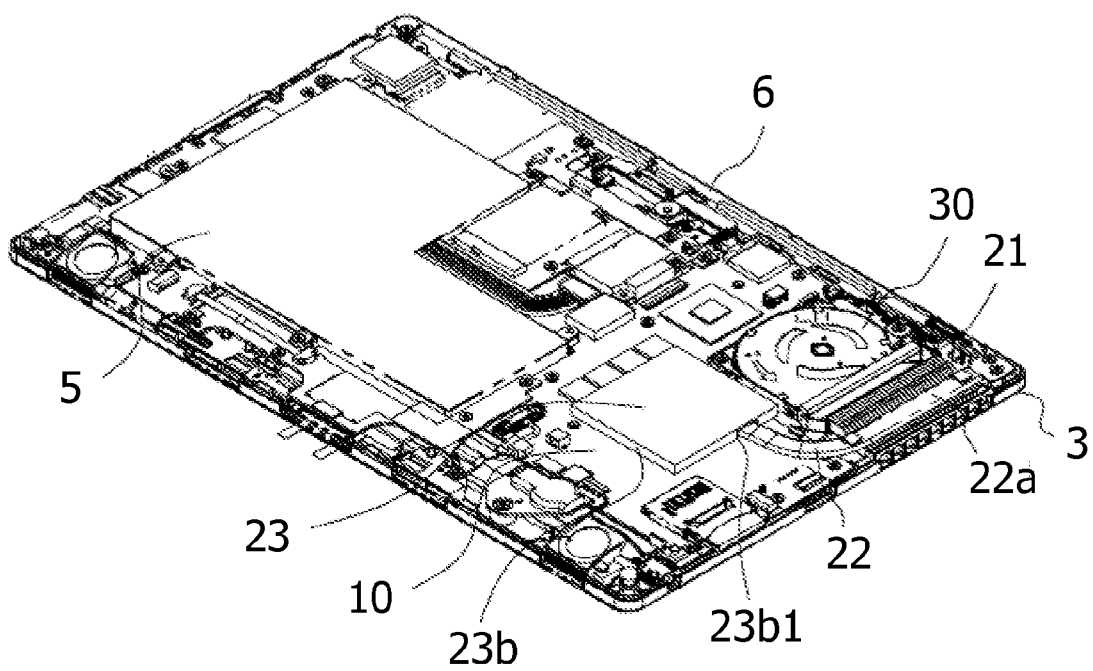
FIG. 4 illustrates an example of an electronic apparatus.

FIGS. 1, 2, 3, and 4 illustrate an example of an electronic apparatus. FIG. 1 is a perspective view of an electronic apparatus 1 when viewed from above. FIG. 2 is a perspective view of the electronic apparatus 1 when viewed from below. FIG. 3 is an exploded view of part of the electronic apparatus 1. FIG. 4 illustrates a state in which a lower cover of the electronic apparatus 1 has been removed. FIGS. 5A to 5F illustrate an example of a cooling device. In FIGS. 5A to 5F, part of the cooling device 20 illustrated in FIGS. 1 to 4 is illustrated on six drawings.

The electronic apparatus 1 may be an information processing device such as, for example, a slate personal computer (PC). The electronic apparatus 1 has a lower cover 2 and an upper cover 3. The electronic apparatus 1 also has a liquid crystal display (LCD) 4 on the same side as the upper cover 3.

The electronic apparatus 1 has a battery mounting area 5 and an antenna mounting area 6, and has a battery and an antenna element mounted in these areas. The electronic apparatus 1 has a circuit board 10, which is the main board. Various electronic parts may be mounted on the circuit board 10. A central processing unit (CPU) 11 is mounted as one electronic part. The CPU 11 has a die 11a at its center. The CPU 11 may be a noise-generating part. The CPU 11 may be a heat-generating part. It is desirable to take both a countermeasure against noise and a cooling countermeasure for the CPU 11. A noise generating part may be the CPU 11 or another electronic part that generates both noise and heat. For example, the noise generating part may be a dual inline memory module (DIMM), a fusion controller hub (FCH), or a chip set.

Figure 5A:
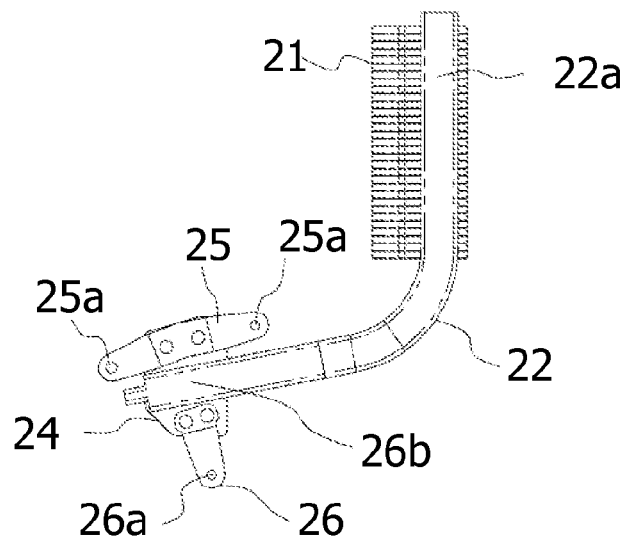
FIGS. 5A to 5F illustrate an example of a cooling device.
Figure 5B:
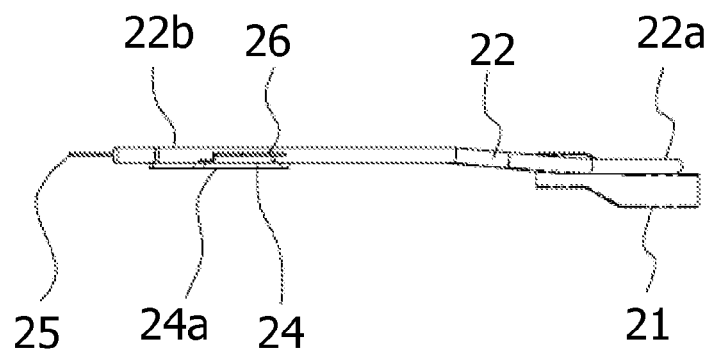
Figure 5C:
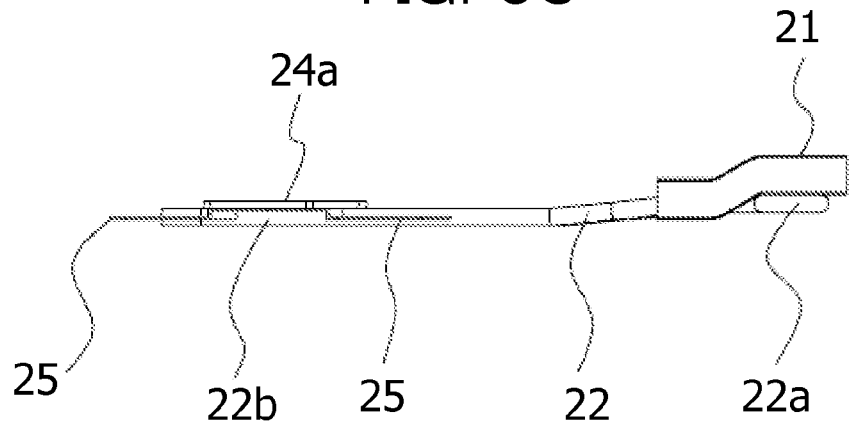
Figure 5D:
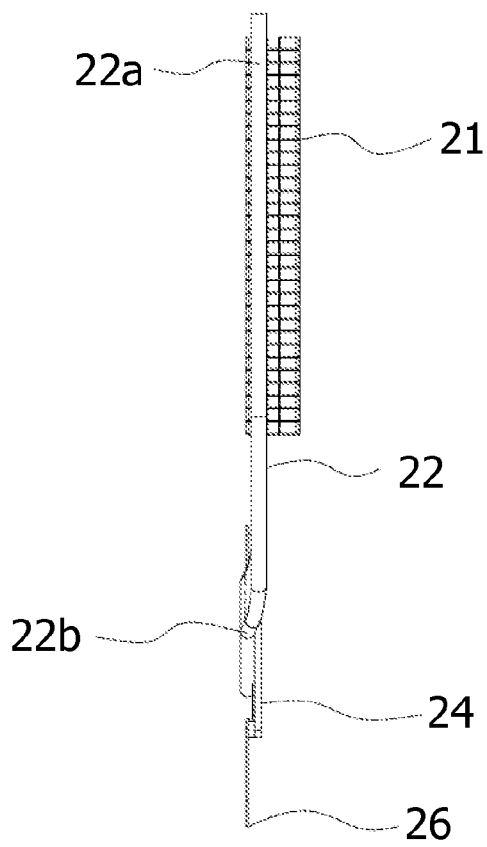
Figure 5E:
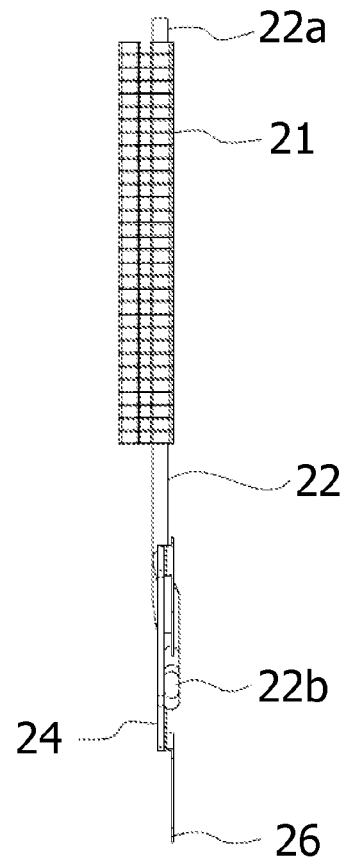
Figure 5F:
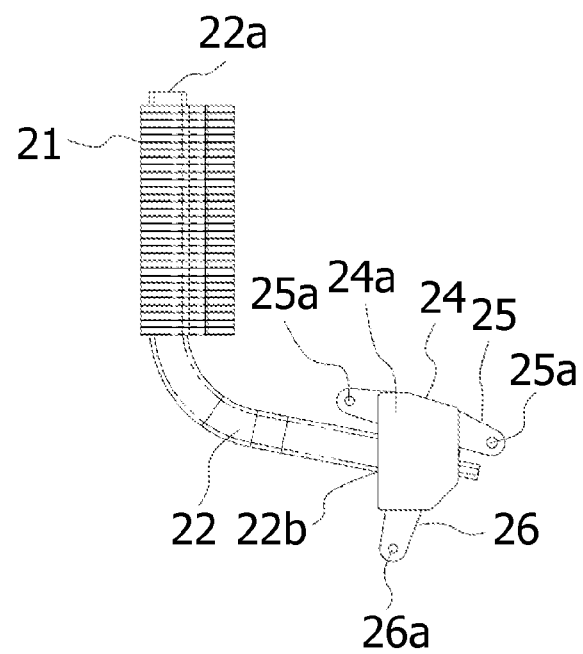

The electronic apparatus 1 has a cooling device 20. FIGS. 5A to 5F are six drawings partially illustrating the cooling device 20 from which a shielding member, which is part of a shielding unit, has been removed. FIG. 5A is a plan view, FIG. 5B is a front view, FIG. 5C is a rear view, FIG. 5D is a right side view, FIG. 5E is a left side view, and FIG. 5F is a bottom view. The cooling device 20 includes a heat dissipating part 21. The heat dissipating part 21 may be an aluminum block having fins. The heat dissipating part 21 may be an aluminum block or any one of various known heat dissipating parts. The cooling device 20 includes a heat pipe 22 as a heat transfer member. The heat transfer member may be a plate-like member. Heat may be efficiently transferred by the heat pipe 22. The heat pipe 22 may have a known structure. As for the heat pipe 22, a copper pipe in which a coolant is sealed may be used. The heat dissipating part 21 is disposed at one end 22a of the heat pipe 22. The heat dissipating part 21 and heat pipe 22 are mutually soldered.

The cooling device 20, disposed opposite to the CPU 11 mounted on the circuit board 10, has a heat-receiving plate 24, which is thermally connected to the CPU 11. The heat-receiving plate 24 may be made of an aluminum material. As illustrated in FIG. 5F, the heat-receiving plate 24 has an abutting surface 24a. When the abutting surface 24a abuts the die 11a of the CPU 11, the abutting surface 24a and die 11a are thermally connected to each other. Wax may be applied between the abutting surface 24a and the die 11a. The heat-receiving plate 24 is disposed at another end 22b of the heat pipe 22. The heat-receiving plate 24 and heat pipe 22 are mutually soldered. A first attachment member 25 and a second attachment member 26 are attached to the heat-receiving plate 24 by rivets 27. Two screw holes 25a are formed in the first attachment member 25. One screw hole 26a is formed in the second attachment member 26. The first attachment member 25 and second attachment member 26 may be formed with an elastic material. The elastic member may be a SUS material or another material. The heat-receiving plate 24 is attached to the circuit board 10 through the first attachment member 25 and second attachment member 26 formed with an elastic material. For example, the heat-receiving plate 24 is attached to the circuit board 10 so as to interpose the circuit board 10 between a mounting bracket 13 having studs 13a and a combination of the first attachment member 25 and second attachment member 26. Each stud 13a is inserted into a stud insertion hole 10a formed in the circuit board 10. A screw hole is formed in each stud 13a. Screws inserted into the screw holes 25a and screw hole 26a are threaded into the screw holes in the studs 13a. The mounting bracket 13 has four studs 13a. The remaining one stud 13a is directly attached to the circuit board 10. When the heat-receiving plate 24 is attached to the circuit board 10 through an elastic material by using the studs 13a, an uneven contact of the heat-receiving plate 24 to the die 11a may be suppressed due to the elasticity of the elastic material, and superior thermal conduction may be obtained. Therefore, the cooling device 20 may also be used to cool a part that generates much heat.

The electronic apparatus 1 has a fan unit 30. In the fan unit 30, a fan 32 is provided inside a casing 31. The casing 31 has a gas outlet 31a. The heat dissipating part 21 is disposed in front of the casing 31. Accordingly, heat dissipation by the heat dissipating part 21 is facilitated.

The cooling device 20 has a shielding member 23. The shielding member 23 may be formed by an aluminum material. The shielding member 23 has a top plate 23a and peripheral walls 23b placed so as to be contiguous to the top plate 23a. One of these peripheral walls 23b has a groove 23b1, through which the heat pipe 22 passes. The shielding member 23 may be formed by drawing a single sheet metal. Accordingly, a concave part in which the CPU 11 is placed is formed without joints at the corners. Superior shielding properties may be obtained. The shielding member 23 is attached to the circuit board 10 by being clamped by clips. The shielding member 23 and heat pipe 22 may be integrated by joining them. In this case, a mounting member configured to mount the shielding member 23 on the circuit board 10 may be attached to the shielding member 23.

The cooling device 20 may provide both a cooling countermeasure and a shielding countermeasure for the electronic apparatus 1. When a shielding function of the cooling device 20 is obtained, non-use of a member that covers an antenna element and other elements affected by noise may be expected. In the electronic apparatus 1, a shielding countermeasure may be taken by covering the noise-generating electronic part instead of covering the parts that are affected by noise, for example.

Figure 6:
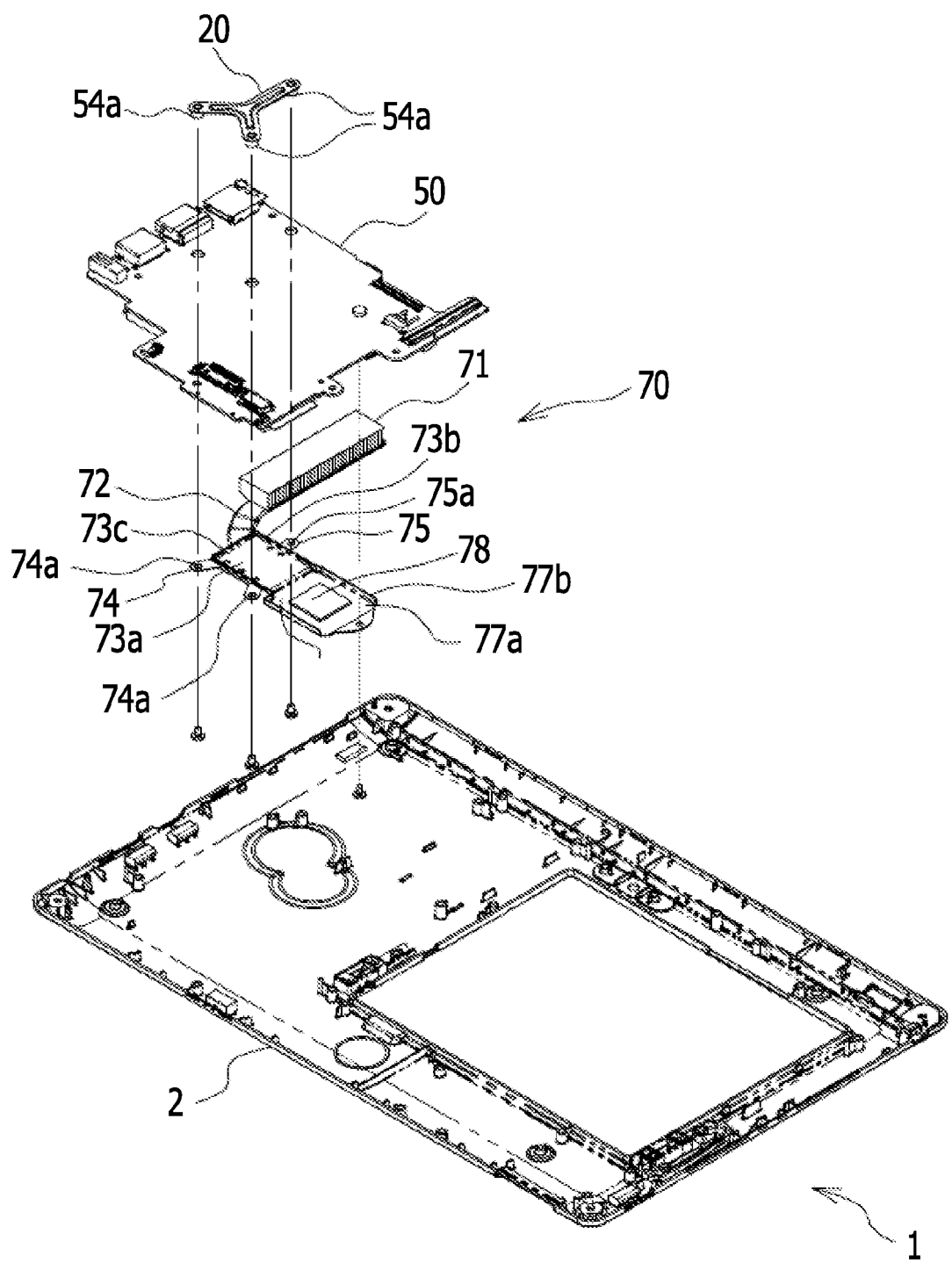
FIG. 6 illustrates an example of an electronic apparatus.
Figure 7:
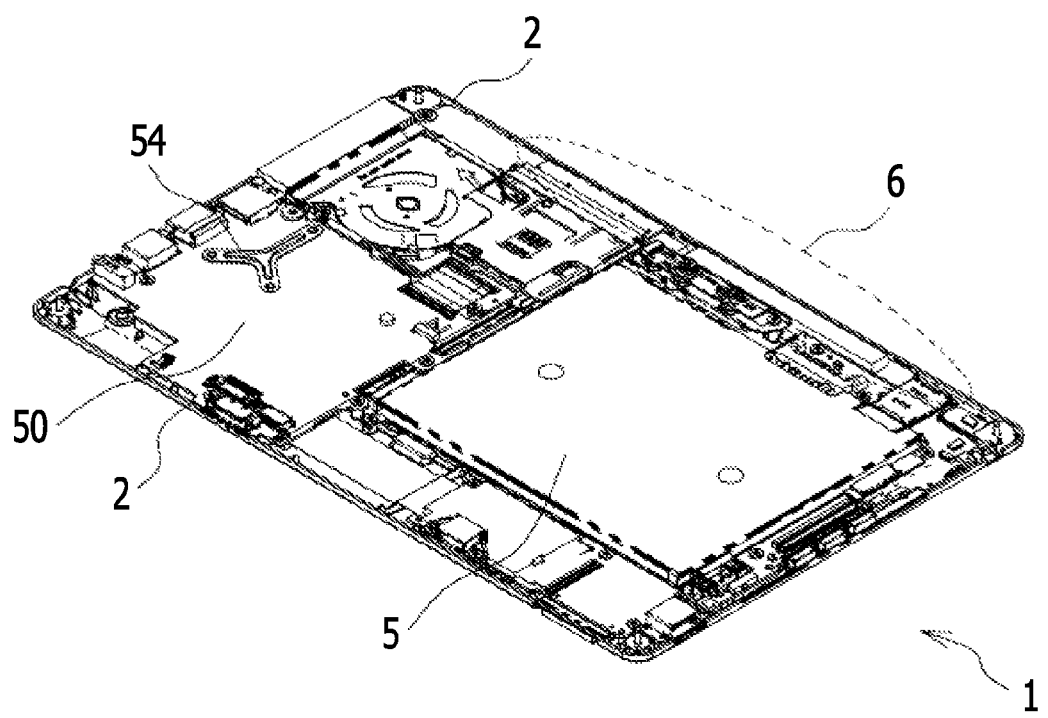
FIG. 7 illustrates an example of an electronic apparatus.
Figure 8:
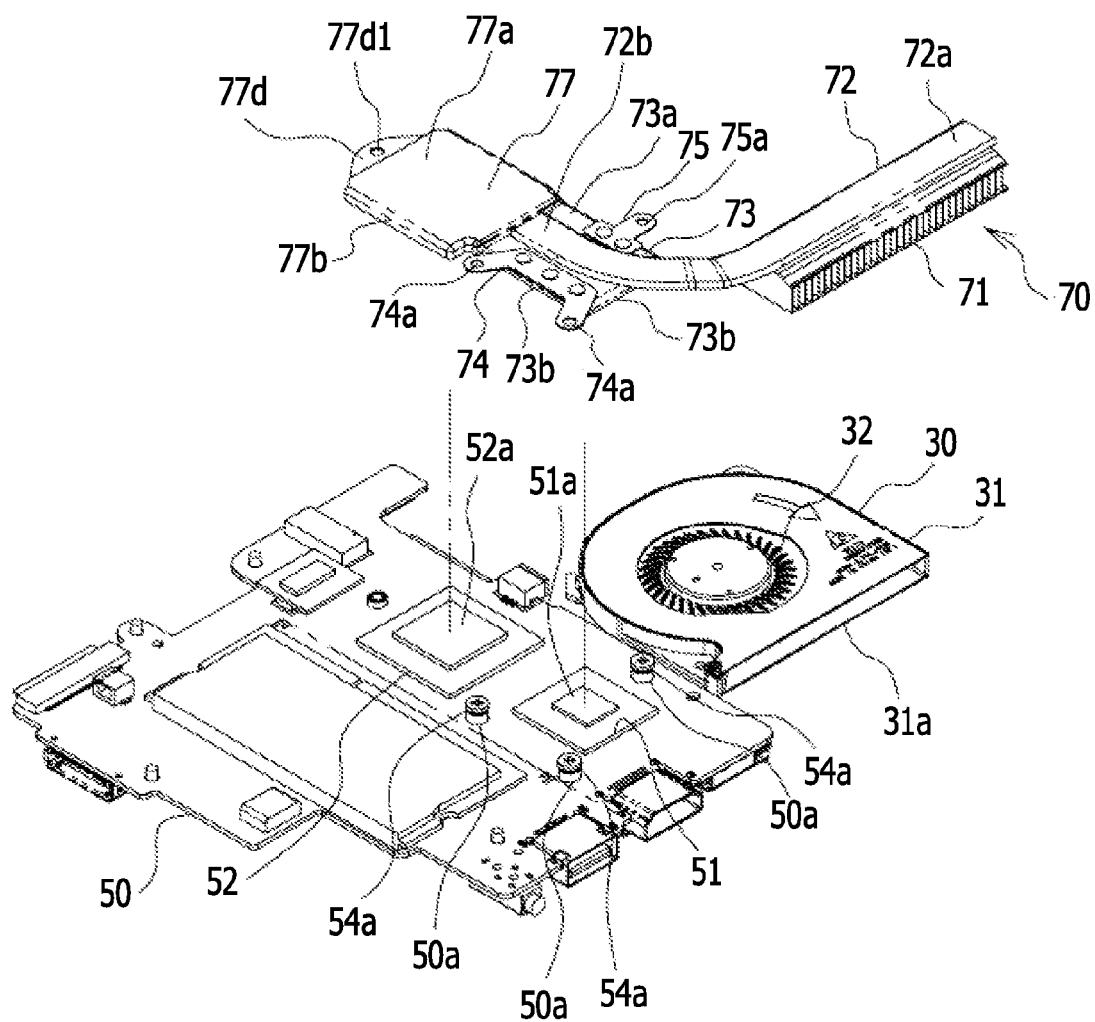
FIG. 8 illustrates an example of a cooling device.
Figure 9:
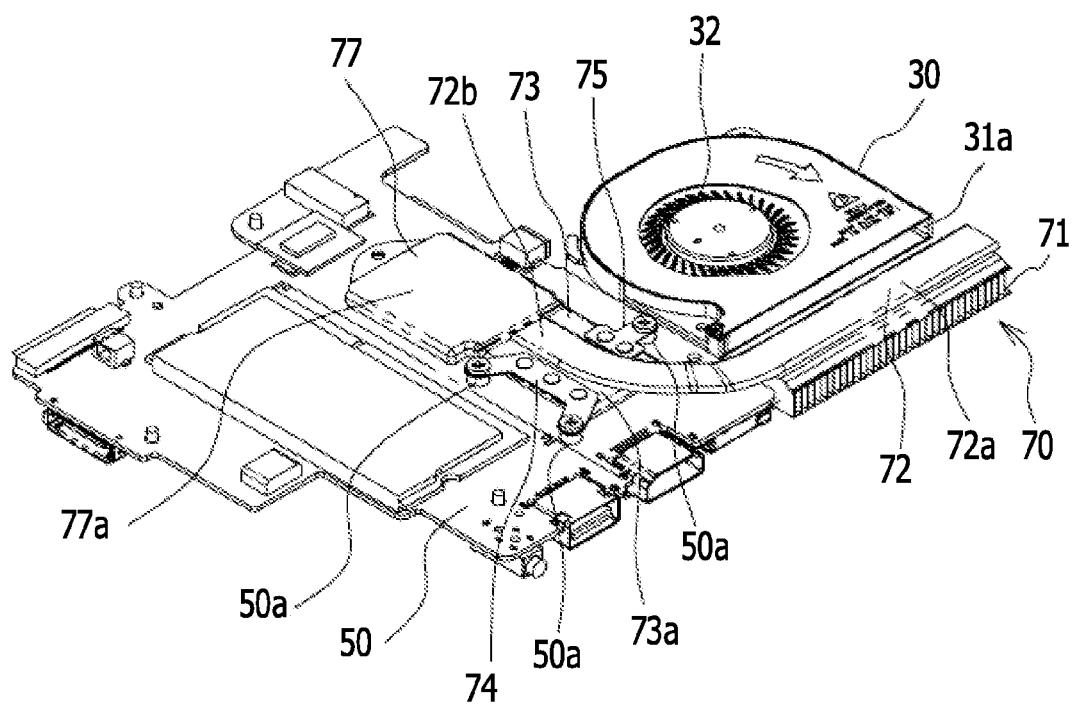
FIG. 9 illustrates an example of a cooling device.

FIGS. 6 and 7 illustrate an example of an electronic apparatus. FIG. 6 illustrates an exploded perspective view of part of the electronic apparatus 1. FIG. 7 is a perspective view illustrating a state in which the upper cover 3 of the electronic apparatus 1 has been removed. FIGS. 8 and 9 illustrate an example of a cooling device. FIG. 8 is an exploded perspective view of a circuit board 50 and a cooling device 70 included in the electronic apparatus 1 in a second embodiment. FIG. 9 is a perspective view illustrating a state in which the circuit board 50 and cooling device 70 of the electronic apparatus 1 have been assembled. FIGS. 10A to 10C illustrate an example of a cooling device. FIG. 10A is a plan view illustrating a state in which the circuit board 50 and cooling device 70 of the electronic apparatus 1 have been assembled. FIG. 10B is a cross sectional view taken along line A-A in FIG. 10A. FIG. 10C is a cross sectional view taken along line B-B in FIG. 10A. FIGS. 11A to 11F illustrate an example of a cooling device. In FIGS. 11A to 11F, the cooling device 70 included in the electronic apparatus 1 are illustrated on six drawings.

The form of the cooling device 70 may differ from the form of the cooling device illustrated in FIG. 1 to FIGS. 5A to 5F. In FIGS. 6 to 9, 10A to 10C, and 11A to 11F, elements that are substantially the same as or similar to elements in FIG. 1 to FIGS. 5A to 5F are denoted by the same reference numerals and detailed descriptions may be omitted.

The electronic apparatus 1 may be an information processing device such as, for example, a slate personal computer (PC).

The electronic apparatus 1 may have the battery mounting area 5 and antenna mounting area 6 illustrated in FIGS. 6 to 9. The electronic apparatus 1 includes the circuit board 50, which is the main board. Various electronic parts are mounted on the circuit board 50. A CPU 51 may be mounted on the circuit board 50 as one electronic part. The CPU 51 has a die 51a at its center. The CPU 51 may an example of a noise-generating part. On the circuit board 50, an FCH 52 is mounted parallel to the CPU 51. The FCH 52 has a die 52a at its center. The FCH 52 may be another noise-generating part different from the CPU 51. As with the CPU 51, the FCH 52 may be an electronic part that not only generates noise but also generates heat, so it is desirable to take both a countermeasure against noise and a cooling countermeasure for the FCH 52. The FCH 52 may generate less heat than the CPU 51.

Figure 11A:
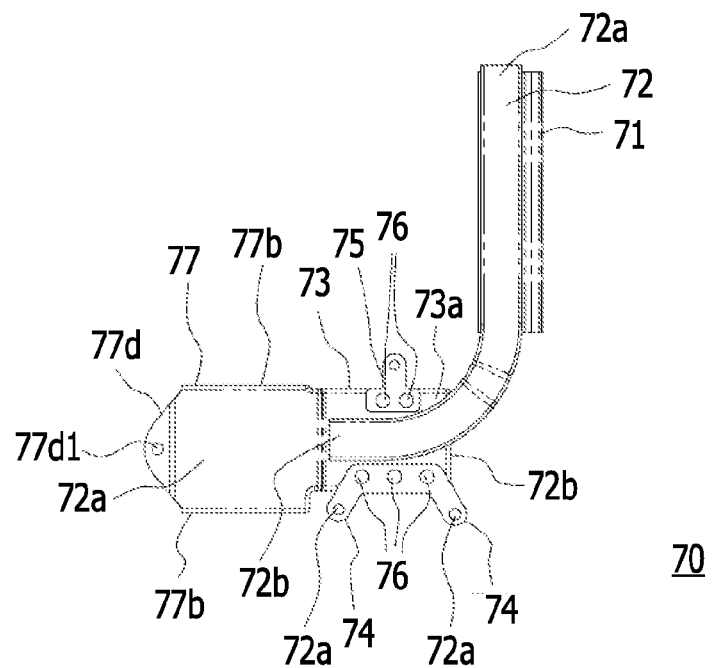
FIGS. 11A to 11F illustrate an example of a cooling device.
Figure 11B:
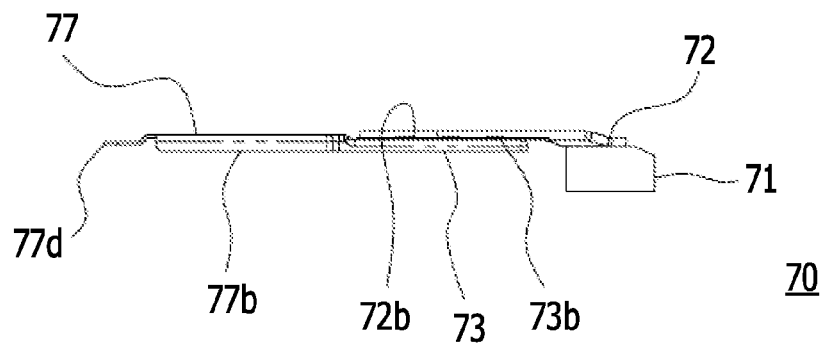
Figure 11C:
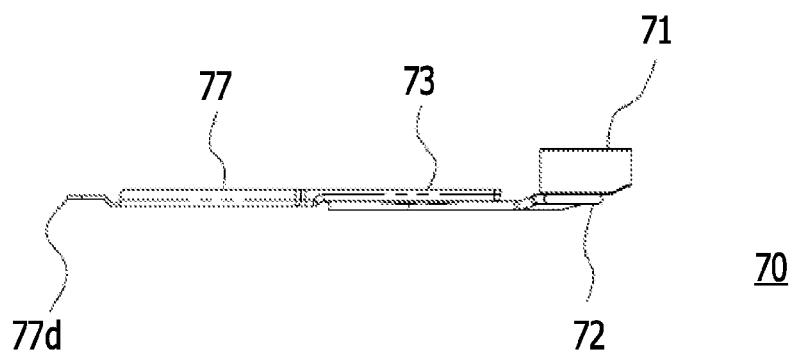
Figure 11D:
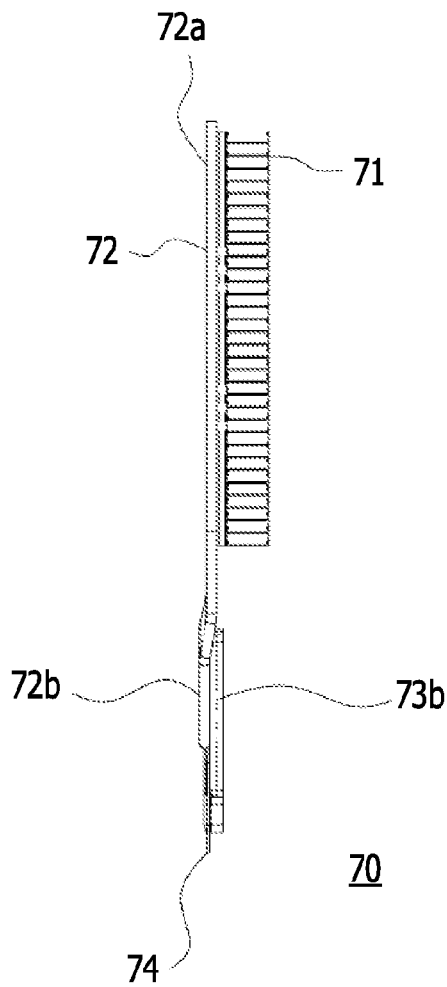
Figure 11E:
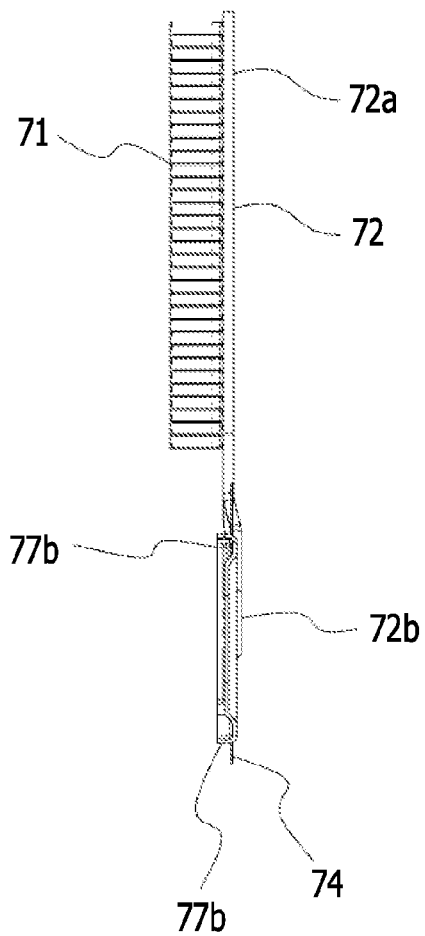
Figure 11F:
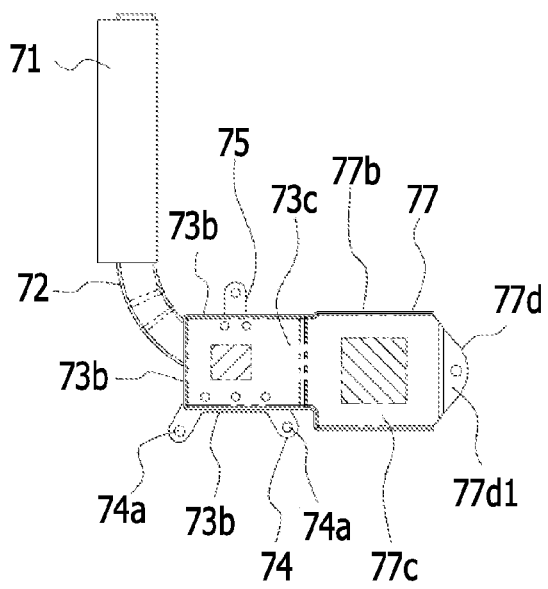

The electronic apparatus 1 has the cooling device 70. FIGS. 11A to 11F are six drawings illustrating the cooling device 70. FIG. 11A is a plan view, FIG. 11B is a front view, FIG. 11C is a rear view, FIG. 11D is a right side view, FIG. 11E is a left side view, and FIG. 11F is a bottom view. The cooling device 70 includes a heat dissipating part 71. The heat dissipating part 71 may be an aluminum block having fins. The heat dissipating part 71 may be an aluminum block or any one of various known heat dissipating parts. The cooling device 70 includes a heat pipe 72 as a heat transfer member. The heat dissipating part 71 is disposed at one end 72a of the heat pipe 72. The heat dissipating part 71 and heat pipe 72 are mutually soldered.

The cooling device 70 has a shielding unit 73. The shielding unit 73 has a heat-receiving plate 73a and peripheral walls 73b placed so as to be contiguous to the heat-receiving plate 73a. The shielding unit 73 may be formed together with an extended part 77 by drawing an aluminum sheet metal. Accordingly, a concave part in which the CPU 51 is placed may be formed without joints at the corners. Since the strength of the shielding unit 73 is increased by the peripheral walls 73b, strength enough to resist the repulsive force of the die 51a having a high strength may be obtained. Bending may be performed to form the peripheral walls 73b. Drawing may be performed to improve shielding properties without forming joints at the corners.

The heat-receiving plate 73a is disposed opposite to the CPU 51 mounted on the circuit board 50 and is thermally connected to the CPU 51. The heat-receiving plate 73a abuts the die 51a of the CPU 51 and is thereby thermally connected to the die 51a. Wax may be applied between the heat-receiving plate 73a and the die 51a. The heat-receiving plate 73a is disposed at another end 72b of the heat pipe 72. The heat-receiving plate 73a and heat pipe 72 are mutually soldered. The cooling device 70 illustrated in FIG. 6 to FIGS. 11A to 11F may be thinned when compared with the cooling device 20 illustrated in FIG. 1 to FIGS. 5A to 5F. As illustrated in FIG. 10C, for example, the heat-receiving plate 73a is included in the shielding unit 73 and is formed integrally with the shielding unit 73, and the heat pipe 72 is attached to the heat-receiving plate 73a. Accordingly, the cooling device 70 may be made thinner than the cooling device 20, in which the heat-receiving plate 24 and shielding member 23 are separately disposed.

The shielding unit 73 includes a first attachment member 74 and a second attachment member 75, which are attached to the heat-receiving plate 73a by rivets 76. Two screw holes 74a are formed in the first attachment member 74. One screw hole 75a is formed in the second attachment member 75. The first attachment member 74 and second attachment member 75 may be formed with an elastic material. The elastic member may be a SUS material. The shielding unit 73 including the heat-receiving plate 73a is attached to the circuit board 50 through the first attachment member 74 and second attachment member 75 formed with an elastic material. For example, the shielding unit 73 is attached to the circuit board 50 by using a mounting bracket 54 having studs 54a to interpose the circuit board 50 between the mounting bracket 54 and a combination of the first attachment member 74 and second attachment member 75. Each stud 54a is inserted into a stud insertion hole 50a formed in the circuit board 50. A screw hole is formed in each stud 54a. Screws inserted into the screw holes 74a and screw hole 75a are threaded into the screw holes in the studs 54a. When part of the shielding unit 73, which is, for example, the heat-receiving plate 73a, is attached to the circuit board 50 through an elastic material, an uneven contact of the heat-receiving plate 73a to the die 51a may be suppressed due to the elasticity of the elastic material and superior thermal conduction may be obtained. The cooling device 70 may also be used to cool a part that generates much heat.

The cooling device 70, which is placed so as to be contiguous to the shielding unit 73, includes the extended part 77 that covers another noise generating part, which is, for example, the FCH 52, different from the CPU 51 covered by the shielding unit 73. The extended part 77 has a top plate 77a and peripheral walls 77b placed so as to be contiguous to the top plate 77a. Accordingly, a concave part 77c in which the FCH 52 is placed is formed inside the peripheral walls 77b. The extended part 77 has an attachment part 77d, in which a screw hole 77d1 is formed. The extended part 77 may be formed together with the shielding unit 73 by drawing an aluminum sheet metal. As with the shielding unit 73, the extended part 77 not only shields the noise-generating part but also contributes to the cooling of the noise-generating part. Accordingly, a heat dissipating rubber 78 is attached to the concave part 77c. In FIG. 10B, the heat dissipating rubber 78 is brought into contact with the die 52a, thermally connecting the extended part 77 and FCH 52 to each other. The other end 72b of the heat pipe 72 is located on the heat-receiving plate 73a included in the shielding unit 73, and does not reach the upper side of the top plate 77a included in the extended part 77. Therefore, the heat of the FCH 52 is transmitted to the extended part 77 through the heat dissipating rubber 78 and is further transmitted to the shielding unit 73 formed integrally with the extended part 77. The heat is then transferred to the heat dissipating part 71 through the heat pipe 72. Since the FCH 52 generates less heat than the CPU 51, the FCH 52 may be cooled even by this heat transfer path.

Since the other end 72b of the heat pipe 72 does not reach the extended part 77, the periphery of the extended part 77 may be thinned.

The CPU 51 and FCH 52 mounted on the circuit board 50 are covered by the shielding unit 73 and extended part 77, which are placed so as to be contiguous. Therefore, the CPU 51 and FCH 52 are mounted close to each other on the circuit board 50. Wiring paths between the CPU 51 and the FCH 52 may be shortened.

The electronic apparatus 1 has the fan unit 30. In the fan unit 30, the fan 32 is provided inside the casing 31. The casing 31 has the outlet 31a. The heat dissipating part 71 is disposed in front of the casing 31. Accordingly, heat dissipation by the heat dissipating part 71 is facilitated.

In the electronic apparatus 1 including the cooling device 70, a cooling countermeasure and a shielding countermeasure are taken for the electronic apparatus 1. In the electronic apparatus 1, a shielding countermeasure is taken by covering the electronic part that generates noise instead of covering parts that are affected by noise. When a shielding function of the cooling device 70 is obtained, non-use of a member that covers an antenna element and other elements affected by noise may be expected. If a plurality of elements that are affected by noise are present, non-use of a countermeasure taken for each element that is affected by noise may be expected. Since the entire circuit board is not covered, the shielding unit may be made compact when compared with a case in which the entire circuit board is covered.

The shielding unit 73 includes the heat-receiving plate 73a; they are integrally formed. Accordingly, the cooling device 70 may be thinned when compared with a case in which the heat-receiving plate and shielding member are separately disposed. Since the number of parts is reduced, non-use of attachment members used to attach individual parts may be expected and the weight of the electronic apparatus 1 may be thereby reduced.

Since the shielding unit covers a part that generates noise and electronic parts covered by a cooling device are placed close to one another, the mounting area of a circuit board may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling device comprising:
a heat dissipating part disposed at an end of a heat transfer member;
a heat-receiving plate disposed at the other end of the heat transfer member, provided opposite to a noise-generating part mounted on a circuit board, and thermally coupled to the noise-generating part; and
a shielding member disposed at the other end of the heat transfer member and including a top plate and peripheral walls extending from all respective sides of the top plate to cover the noise-generating part and the other end of the heat transfer member within the peripheral wall, at least one of the peripheral walls having a groove.

2. The cooling device according to claim 1, wherein the shielding member includes the heat-receiving plate and a peripheral wall provided beside the heat-receiving plate.

3. The cooling device according to claim 1, wherein the shielding member includes the heat-receiving plate formed by drawing a sheet metal and a peripheral wall provided beside the heat-receiving plate.

4. The cooling device according to claim 1, wherein the heat-receiving plate is attached to the circuit board through an elastic material.

5. The cooling device according to claim 1, further comprising,
an extended part configured to cover another noise-generating part different from the noise-generating part that the shielding unit covers.

6. The cooling device comprising according to claim 1, wherein the other end of the heat transfer member is located on the heat-receiving plate.

7. The cooling device according to claim 1, wherein the heat transfer member is a heat pipe.

8. An electronic apparatus comprising:
a circuit board on which a noise-generating part is mounted; and
a cooling device, the cooling device includes:
a heat dissipating part disposed at an end of a heat transfer member;
a heat-receiving plate disposed at the other end of the heat transfer member, provided opposite to the noise-generating part mounted on a circuit board, and thermally coupled to the noise-generating part; and
a shielding member disposed at the other end of the heat transfer member and including a top plate and peripheral walls extending from all respective sides of the top plate to cover the noise-generating part and the other end of the heat transfer member within the peripheral walls, at least one of the peripheral walls having a groove.

9. The electronic apparatus according to claim 8, wherein the shielding member includes the heat-receiving plate and a peripheral wall provided beside the heat-receiving plate.

10. The electronic apparatus according to claim 8, wherein the shielding member includes the heat-receiving plate formed by drawing a sheet metal and includes a peripheral wall provided beside the heat-receiving plate.

11. The cooling device according to claim 1, wherein the noise-generating part and the other end of the heat transfer member are disposed between the shielding member and the circuit board.

12. The electronic apparatus according to claim 8, wherein the noise-generating part and the other end of the heat transfer member are disposed between the shielding member and the circuit board.

13. The cooling device according to claim 1, wherein the heat transfer member passes through the groove in a direction of the end of the heat transfer member.

14. The electronic apparatus according to claim 8, wherein the heat transfer member passes through the groove in a direction of the end of the heat transfer member.

* * * * *